United States Patent [19]

Reichert et al.

[11] 4,443,767

[45] Apr. 17, 1984

[54] VARIABLE PHASE LOCK CONTROL

[75] Inventors: James K. Reichert, Willowdale; Michael A. Stott, Ottawa, both of Canada

[73] Assignee: Her Majesty the Queen in Right of Canada, as represented by the Minister of National Defence, Ottawa, Canada

[21] Appl. No.: 237,450

[22] Filed: Feb. 23, 1981

[30] Foreign Application Priority Data

Mar. 21, 1980 [CA] Canada ................................. 348080

[51] Int. Cl.³ ....................... H03K 3/78; H03K 13/02; H03L 7/00; H03L 7/08
[52] U.S. Cl. ..................................... 328/155; 328/55; 377/43
[58] Field of Search ........................... 328/55, 155, 14; 307/262, 511; 235/92 PS; 377/43

[56] References Cited

U.S. PATENT DOCUMENTS 3,500,214  3/1970  Broadhead, Jr. et al. ............. 328/55
3,629,715  12/1971  Brown ................................. 328/155
4,180,778  12/1979  Worthington ........................ 328/55
4,290,022  9/1981  Puckette ............................. 328/55
4,301,415  11/1981  McFayden ............................ 328/14

Primary Examiner—John S. Heyman
Assistant Examiner—Timothy P. Callahan
Attorney, Agent, or Firm—Stevens, Davis, Miller & Mosher

[57] ABSTRACT

The present invention is a system for accurately phase locking two signals having the same frequency but which are of arbitrary wave shape, and which can be at very low or at substantially higher frequencies. Elements of two signals are stored at sequential address locations in a pair of ROMs. An oscillator drives a counter which provides a sequential address output signal, which is used to address the first ROM. A binary signal which can be generated from a manual control calibrated in 360° provides a phase control signal which is added to an address signal generated from the same oscillator, and which is used to address the second ROM. The increment between the two ROMs established from the control provides control over the phase differential between the two generated signals. Since the addresses of both ROMs are generated from the same oscillator, their frequencies are the same, and their phases are locked at the desired phase differential.

21 Claims, 3 Drawing Figures

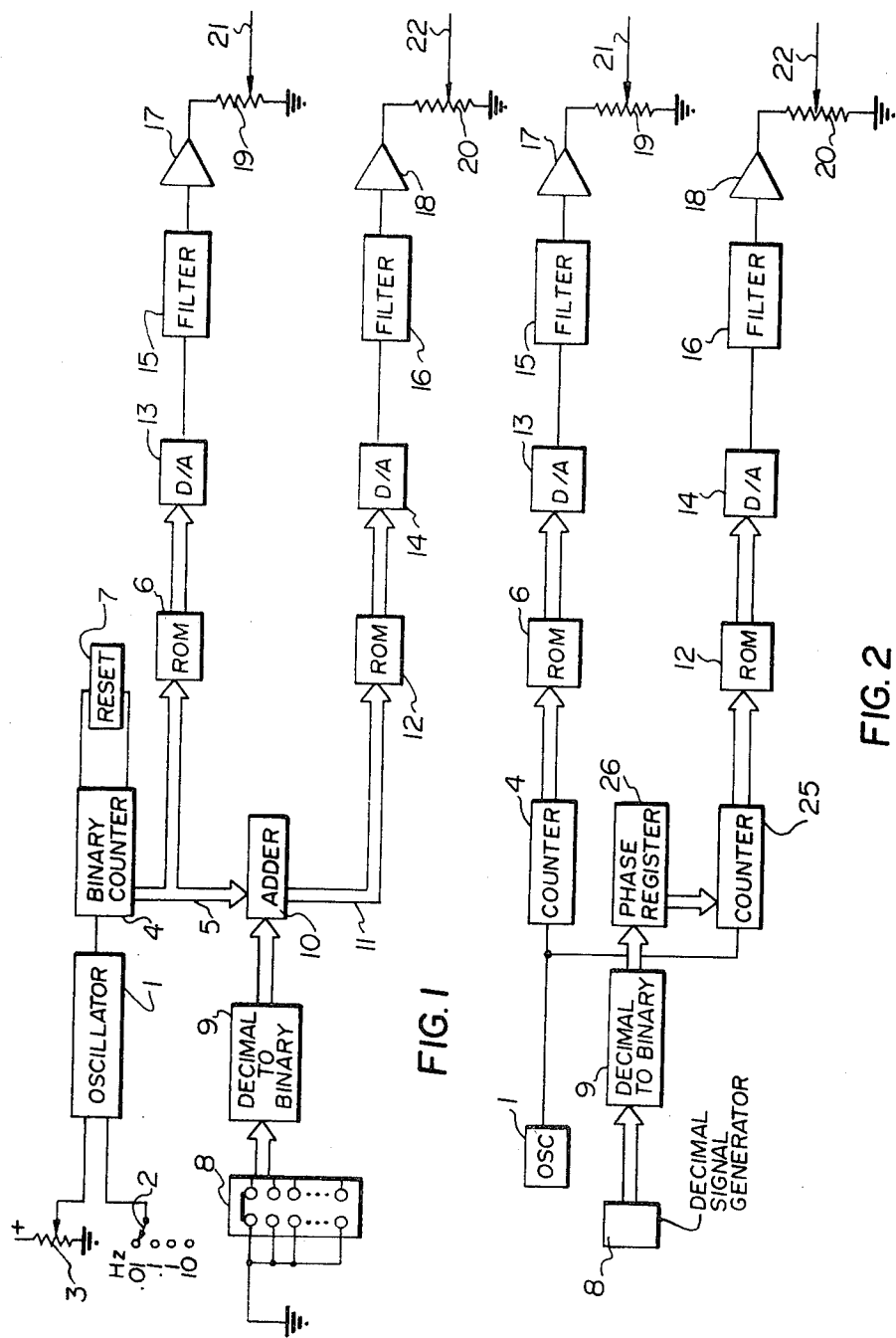

VARIABLE PHASE LOCK CONTROL

This invention relates to a circuit for fixing the phase relationship between a pair of signals having the same frequency and the same or differing waveforms, and has particular utility for relative phase control of two very low frequency signals.

Where it is required to control the relative phases of a pair of signals of similar frequency, but of the same or differing waveform, the frequency of the two signals is sometimes adjusted or varied by automatic control signals. For example signals for the control of the pitch and roll axes of a spacecraft simulator must have their phase relationship very accurately maintained. In order to avoid hazardous simulator movements when a human subject is contained within the simulator, the control signals must also be able to perform at very low frequencies. As an example, such control signals are sometimes sinusoidal in waveform and vary from 0.001 hertz to 10 hertz.

A previously proposed method of phase locking such control signals is to provide two triggerable signal generators which are used in conjunction with separate timing pulses which repetitively trigger the generators with a time delay appropriate for the signal frequencies and required phase delay. However this method utilizes hardware which is both complex and expensive. Further, accurate adjustment of the triggers is difficult. Should the signals be required to be of different wave shape, they could not easily be derived from the same signal source. Further, analog circuitry cannot easily handle the very low frequencies noted above with stability and accuracy.

The present invention provides means for accurately phase locking two signals having the same frequency, but which are of arbitrary wave shape and which can be at the aforenoted very low, or at substantially higher frequencies. Further, the components used are inexpensive, and can include means for controlling the frequency of both of the signals. The output signals produced according to the preferred embodiment of the invention are analog in form, but the invention is not restricted thereto since digital representations of sequential elements of the analog waveform can be utilized as output signals.

The preferred embodiment of the invention is a variable phase lock control comprising first means for digitally storing a representation of a first predetermined waveform signal, the addresses of sequential elements of the first signal being themselves sequential, and means for addressing the first storage means sequentially and cyclically to repetitively read out the stored first signal. Second means is utilized for digitally storing a representation of a second predetermined waveform signal, the addresses of sequential elements of the second signal being sequential, the number of elements of the first and second signals being similar. A binary signal generator is used to generate a signal having a value from 0 to the number of elements of the first and second signals. Means is provided for adding the binary signal and the addresses of the elements of the first signal to provide a second address signal. Further means is used for addressing the second storage means sequentially and cyclically with the second address signal to read out the stored second signal. As a result the read-out first signal and the read-out second signal have a phase relationship dependent on the value of the binary signal.

The invention is also a method of generating a pair of phase locked signals comprising addressing a pair of memories, each of which has sequential elements of a predetermined wave shape signal stored digitally at sequential memory locations, and maintaining a predetermined address increment between the address signals applied to the respective memories, whereby the pair of output signals is generated at the output of the memories. The address increment thus affords precise control of the phase difference between the signals. In the preferred embodiment, the invention includes the further steps of converting the output signals to a pair of analog signals, and of filtering the analog signals to substantially remove ripple carried thereby.

A better understanding of the invention will be obtained by reference to the detailed description below, and to the following drawings, in which:

FIGS. 1 and 2 are block schematics of two embodiments of the invention, and

Figure 3:
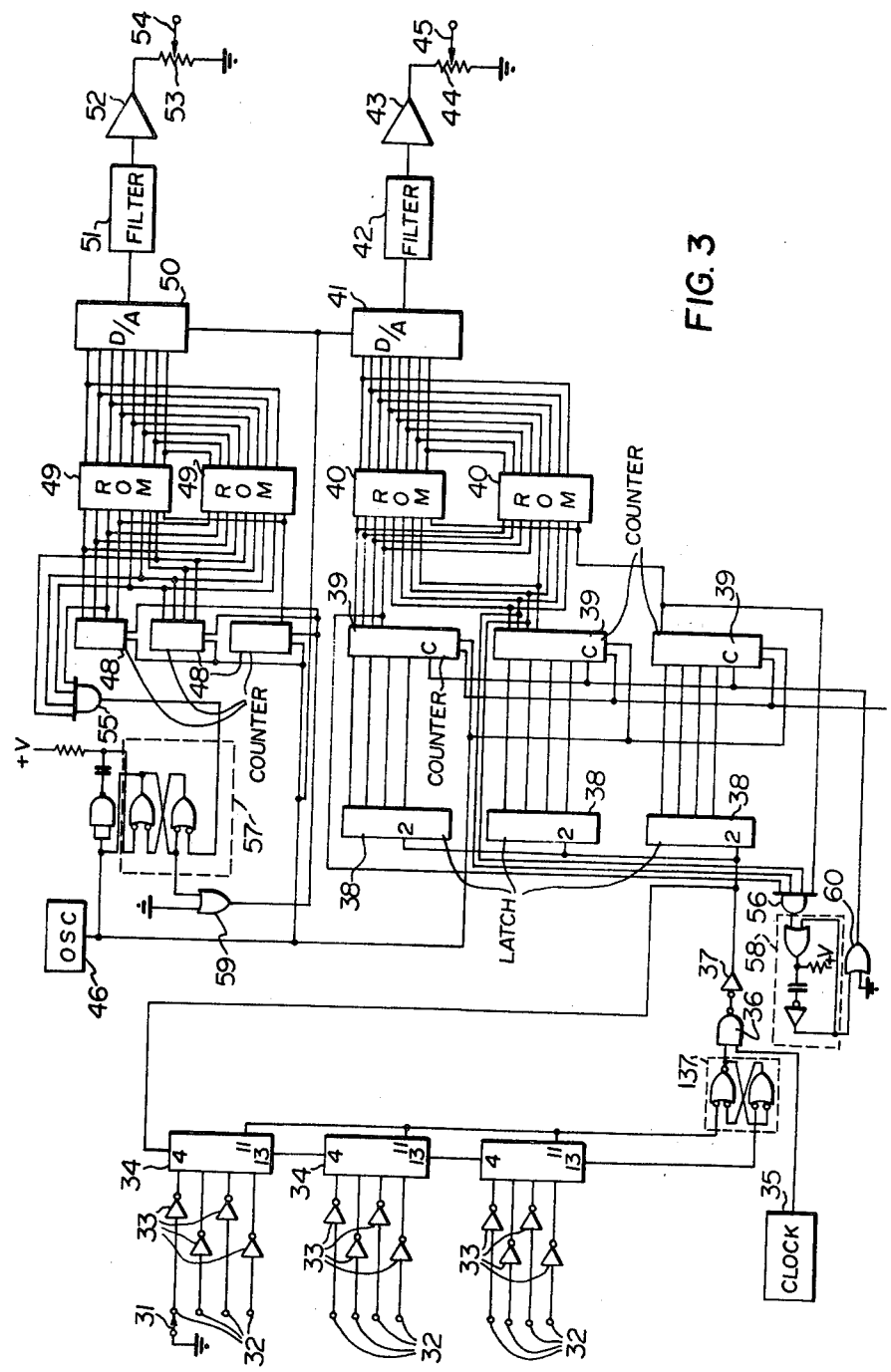
FIG. 3 is a logic diagram of the preferred embodiment of the invention.

Turning now to FIG. 1, a block diagram of the preferred form of the invention is shown. A voltage controlled oscillator 1 is connected to a coarse frequency adjusting switch 2, and to a potentiometer 3, each of which applies a variably selected voltage to the oscillator 1 for respective course and fine frequency control. For the generation of spacecraft simulator pitch and roll control signals, it is preferred that the positions of switch 2 should be such that the first position allows the potentiometer 3 to select a frequency of oscillation between 0.001 and 0.01 hertz, the second position between 0.01 and 0.1 hertz, the third position between 0.1 and 1 hertz, and the fourth position between 1 and 10 hertz.

Oscillator 1 provides an output signal which is a multiple of the selected frequency, e.g. by 250 or 360. The output of oscillator 1 should be connected to the signal input of a binary counter 4. The multiplication factor of the oscillator 1 is chosen for the particular application desired, and in one successful prototype, a multiplicaton factor of 360 was used, for accessing 360 elements of a cycle of the waveform.

Binary counter 4 has its binary output connected to address bus 5, which is cnnected to the address input of a read-only memeory (ROM) 6. The ROM has one cycle of a predetermined wave shape signal digitally stored, each sequential element of which is located at a memory location having a sequential address.

Binary counter 4 also includes a reset circuit 7, which is adapted to reset the counter after the count has reached an address which is the address retaining the last element of the stored predetermined wave shape signal. Upon being reset the binary counter is recycled.

A decimal number generator 8, which can be a thumb-wheel switch is connected to the input of a decimal to binary converter 9. The decimal to binary converter 9 thus generates the binary signal equivalent to the decimal input signal, at its output.

The decimal number generator 8 thumb-wheel switch preferably is calibrated to 360° (phase difference), and a decimal output designated in 100's, 10's, and units. The decimal output leads are connected to the input of decimal to binary converter 9.

The binary output of decimal to binary converter 9 is connected via a bus to one of two inputs of adder 10. The other input of adder 10 is connected to the address bus 5, and thus receives the address signals applied to ROM 6.

The output of adder 10 is connected to address bus 11, which is connected to the address input of ROM 12. ROM 12 stores a second predetermined waveshape signal in a manner similar to ROM 6, and should have elements thereof stored at a similar number of addresses as in ROM 6. The two stored signals can be either the same waveshape, or can be different.

The outputs of ROMs 6 and 12 are respectively connected to digital/analog converters 13 and 14. The output of digital-to-analog converters 13 and 14 are connected to the inputs of corresponding low pass filters 15 and 16. Output buffers 17 and 18 have their inputs connected to the outputs of corresponding filters 15 and 16, and potentiometers 19 and 20 are connected to the outputs of buffers 17 and 18. The output signals which are phase locked relative to each other are applied to output leads 21 and 22 from potentiometers 19 and 20.

In operation, the frequency of both output signals is established by the adjustment of the frequency of oscillator 1. Switch 2 is adjusted to a coarse frequency range and potentiometer 3 is adjusted for fine frequency control. Oscillator 1 generates output pulses which are applied to the input of binary counter 4. Binary counter 4 thus provides a sequentially increasing binary number as the pulses are counted. Since 360 elements of the signal to be generated are stored at 360 memory locations (each conveniently one degree of the waveform cycle which is stored) a 360 multiple of the selected frequency will cause 360 memory addresses to be generated during the time of one cycle.

The binary count digital output signal of binary counter 4 is applied to address bus 5, and to the address input of ROM 6. As ROM 6 is addressed sequentially, it reads out the elemental values of the cycle of the predetermined wave shape signal stored therein, to digital-to-analog converter 13.

After generating the address of the last element of the signal cycle stored in ROM 6, the binary counter 4 is reset by reset circuit 7.

Prior to setting the circuit in operation, the phase control switch 8 is operated to set the phase difference between the two signals to be generated. As was noted earlier, the switch can be calibrated from 0° to 360°. The digital representation which is applied to decimal to binary converter 9, however, need not necessarily be one of 360 units unless there are 360 elements of each signal stored at 360 locations as is preferred.

The phase difference signal in decimal form is applied to decimal-to-binary converter 9, which converts it to a binary signal. The binary signal is applied to one input of adder 10, and the address signal on address bus 5 is applied to a second input of adder 10. The two binary signals are added, and the result is applied via address bus 11 to the address input of ROM 12.

Clearly as oscillator 1 provides output pulses, sequentially advancing address signals are generated and are applied to the address input of ROM 6, whereby the stored output signal is read out. The same address signal incremented by a value manually set and corresponding to a decimally selected phase angle in degrees is provided on address bus 11 from adder 10 and is applied to the address input of ROM 12. Since this signal is continuously advancing with the signal applied to ROM 6, but with a difference determined by the address increment (phase difference), two output signals are respectively read out of ROM 6 and ROM 12, and are applied to digital-to-analog covnerters 13 and 14.

Once the address of the last element of the signal cycle in ROM 6 has been reached, binary counter 4 is reset, which causes ROM 6 to begin reading out the addresses of the first element of a renewed cycle.

The output signals of ROMs 6 and 12 are converted to analog form in converters 13 and 14, and are subsequently filtered in low pass filters 15 and 16 to remove ripple. After translation in buffers 17 and 18, selected portions of the signals can be obtained on output leads 21 and 22 by control of potentiometers 19 and 20.

It should be noted that the frequency of both output signals are the same, since their incremental addresses are generated from the same oscillator 1. The frequency can be varied to the limit of response by ROMs 6 and 12, and are not limited by the frequencies noted above.

While a particular phase difference is manually set by the apparatus described above, the phase difference can be made variable by using a control signal. The control signal can be either in binary form, (and can provide a binary signal to adder 10 which is varied as desired to change the phase between the two output signals), or can be decimal in form and be applied to decimal to binary converter 9 in place of the decimal signal generator switch 8.

The output signals from ROMs 6 and 12 can also be utilized for other means without necessarily being converted to analog signals as described above.

The frequency range of the filters 15 and 16 can be made variable for selection of optimum passband.

The wave shapes of the signals stored in ROMs 6 and 12 can be the same, or can be different. ROMs are available from Intel Corporation which automatically generate sine waves upon being addressed sequentially.

Third and fourth ROMs (not shown) can be respectively connected with their address inputs to address buses 5 and 11. The outputs of the two ROMs connected to address bus 5 can be multiplexed together; the outputs of the two ROMs connected to address bus 11 can be multiplexed together. If ROMs 6 and 12 store sine wave waveforms for example, and the other two ROMs store another signal waveform, a switch can allow selection of either of the two since waveforms and/or either of the two other signal waveforms as the output signals.

A second oscillator and binary counter (not shown) can also be utilized in a manner similar to oscillator 1 and binary counter 4 to drive ROM 12. In this case the output of adder 10 and of the second binary counter should be multiplexed together, and the output of the multiplexer should be connected to address bus 11. In this case address bus 11 is not connected directly to the output of adder 10. A manual switch is used to select either the output of adder 10 or the output of the second counter to be applied to the address input of ROM 12. The entire apparatus can then be used to generate two different frequency signals, or two signals of one frequency controlled by oscillator 1 and phase locked together by a controlled phase.

FIG. 2 is a block diagram of a second embodiment of the invention. As oscillator 1, which can be controlled, and of the same form as that described with reference to FIG. 1, has its output connected to a pair of binary counters 4 and 25. A decimal number signal generator 8 such as the switch described earlier is connected to the input of a decimal to binary converter 9, also similar to that described earlier. The output of the decimal to binary converter is connected to a phase register 26, which has its output connected to a counter set input of counter 25.

The outputs of counters 4 and 25 are connected to the address input of corresponding ROMs 6 and 12 in a similar manner as the address buses 5 and 11 in the embodiment of FIG. 1. The output of ROMs 6 and 12 are connected respectively to the inputs of D/A converters 13 and 14, which have their outputs connected to the inputs of filters 15 and 16. The outputs of filters 15 and 16 are connected to the inputs of corresponding buffers 17 and 18, which have their outputs connected via potentiometers 19 and 20 to output leads 21 and 22 respectively.

The circuits including ROMs 6 and 12 through to output leads 21 and 22 are connected and operate similar to the embodiment of FIG. 1.

The oscillator 1 also operates as in the embodiment of FIG. 1, and drives counter 4, which has its output terminals connected to the address input of ROM 6.

Similarly, the output of oscillator 1 is connected to the input of counter 25 which has its output terminals connected to the address input of ROM 12 in a similar manner to counter 4 and ROM 6.

Decimal signal generator 8 applies a signal to decimal to binary converter 9 in a similar manner as the similarly referenced elements of the embodiment of FIG. 1. However the output terminals of converter 9 are connected to a phase register 26, which can be a plurality of parallel latches. Register 26, having its input connected to counter 25, establishes an initial count value from which the count increments of the successive cycles from oscillator 1 are initiated. The address output from counter 25 thus begins at a binary number which is advanced from its normal zero reset position, and therefore the numeral held in phase register 26 acts as a phase shift determinator for the resulting waveform obtained at the output of ROM 12.

The output signals from ROMs 6 and 12 are thus out of phase established by the numeral stored in phase register 26, which numeral is set in the decimal signal generator 8. It should be noted that the decimal signal generator 8 merely connects a plurality of high level or (preferably) ground d.c. levels (as required by converter 9) on a group of leads to establish the phase differential.

FIG. 3 is a logic diagram of the embodiment of the invention shown in FIG. 2. A switch having moving contact 31 connected to ground and a plurality of fixed contacts 32, is connected with the fixed terminals (via inverters 33 if required) to the inputs of decimal to binary converters 34, which are connected in serial fashion in a well known manner. The converters can be type 74LS192, available from Texas Instruments Inc. of the United States. A ground placed via this switch on any one of the contacts 32, translated via inverter 33 to one of the inputs of converters 34, provides a reset output upon a count, established by the contact location, being reached. The decimal to binary converter is driven by a local clock 35 which has its output connected to one input of NAND gate 36, which has its output connected to the input of inverting buffer 37, the output of which is connected to the clock input (4) of the first of the serial converters 34. The combined output of the converters is connected via flip flop 137 to the second input of NAND gate 36. Accordingly, as clock 35 counts, output signals appear at the output of inverter 37, until the digit established by the ground to the aforenoted switch has been reached. At this point the output of converters 34 and inverter 37 goes to high level. To reset the converters 34, a manually operated panel mounted grounding pushbutton should be connected to their reset inputs (not shown).

The output of inverter 37 is connected to the input of latches 38. Latches 38 are connected to counters 39, and together count and retain the digit count of the clock pulses 35 which had been reached prior to the output of converters 34 going to high level.

The parallel outputs of counters 39 are connected to the address inputs of ROMs 40. A pair of ROMs are connected in parallel in order to obtain the required signal resolution increment capacity, but if a single ROM with sufficient resolution is available, it may of course be used.

The outputs of ROMs 40 are connected to the input of digital to analog converter 41, and the output of D/A converter 41 is connected to the input of filter 42; the output of filter 41 is connected to the input of buffer 43, and the output of buffer 43 is connected via potentiometer 44 to output lead 45.

It may be seen that the digit count reached by the clock 35 before the output of converters 34 goes to high level is stored in counters 39, which provide an output signal forming an address for ROM 40. A digital output signal stored at the designated address thus is applied to the input of digital to analog converter 41.

Oscillator 46 is connected to the serial count input of counters 39. As oscillator 46 provides a clock output signal, the digit count retained in counters 39 is progressively advanced, and the resulting digital output signal advances sequentially with the timing of oscillator 46, thus advancing the memory addresses for ROMs 40. Accordingly a sequence of digital signals stored at the addressed memory locations of ROMs 40 forming the digital value increments of the output signal waveform is provided to the input to digital to analog converter 41.

Digital to analog converter 41 converts the digital signals to an analog output signal and applies it to the input of filter 42. Filter 42 removes any stair-step ripple modulation carried by the analog signal applied thereto, and the resulting smooth output signal is applied via buffer 43 to output lead 45, the adjustment in amplitude by potentiometer 44.

In summary, the function of this circuit causes the retrieval of an analog output signal which is incrementally stored at addressable locations in ROMs 40, the increments of the stored signal being accessed at the address locations, which addresses are sequentially generated in counters 39, driven by oscillator 46. The initial address is obtained from the digital signal stored in latches 38, which signal is established by the position of switch 31.

Oscillator 46 is also connected to the serial digit count inputs of a series of counters 48. The parallel outputs of counters 48 are connected to the address inputs of ROMs 49, counters 39 are connected to ROMs 40. The data signal output terminals of ROMs 49 are connected to corresponding inputs of digital to analog converter 50, which has its analog signal output connected to the input of filter 51; the output of filter 51 is connected to the input of buffer 52, which has its output connected to output lead 54 via potentiometer 53.

ROMs 49 are similar to ROMs 40, digital to analog converter 50 is similar to converter 41, filter 51 is similar to filter 42, buffer 52 is similar to buffer 43, etc. The signal stored in ROMs 49 can be of similar or different form to the signal stored in ROMs 40.

The operation of counters 48 with ROMs 49, digital to analog converter 50, etc., is similar to the operation of counters 39, ROMs 40, digital to analog converter 41, etc. as described earlier. However in this case counters 48 do not have a stored preset count, and upon resetting, start counting at an initial all "0" or all "1" digital count.

Upon initialization, assuming the counters were reset, the address signals provided from counters 48 begin addressing ROMs 49 at an initial all "0" or all "1" address, and with subsequent pulses from oscillator 46, the address signal count advances, causing a ROM digital output signal to be provided corresponding to the stored data (e.g. a sine wave). However at the same time a ROM digital output signal is provided which has been stored in ROM 40, but which is out-of-phase therewith with the signal from ROMs 49 depending on the value of the digital signal stored in latches 38, which initializes counter 39 at a count in advance of the aforenoted all "0" or all "1" address.

At a counter output address which is determined by the last address of the signal sequence in the ROMs, the corresponding address leads from counters 48 are connected to inputs of AND gate 55, and similar leads from counters 39 are connected to the inputs of AND gate 56. The output of AND gate 55 is connected to the input of monostable 57 and the output of AND gate 56 is connected to the input of monostable 58. The output of monostables 57 and 58 are connected respectively to the inputs of OR gates 59 and 60 (operating as inverters) the output of which are connected to the CLEAR inputs of corresponding counters 48 and 39. The result is a resetting thereof to the first signal increment address in counters 48 and 39 at the appropriate times for recycling the output signals. As counters 48 and 39 sequence, once they reach a predetermined digit designating the last ROM address where the signal increment is stored, they are reinitialized.

The output of oscillator 46 is also connected to the strobe inputs of digital to analog converters 41 and 50, which enables their reading of the digital signals input thereto and converstion to a corresponding analog level.

It may be seen therefore that as counters 48 advance, an analog output signal is produced on output lead 54. Similarly as counters 39 are advanced an analog output signal is produced on output lead 45, but this signal is different in phase from the signal on lead 54 by the address signal increment stored in latch 38, determined by the aforenoted switch setting.

ROMs 40 and 49 can usefully be EPROM type 2704 which is available from INTEL Corporation of the United States, and can be programmed to store the signals as required by the user. Since the stored signals can be similar or different in form, a simple and convenient structure is thus provided for varying and phase locking their phases in a desired manner.

It should also be noted that the initial address signal stored in latch 38 can be driven from a digital signal source whereby the relative phases of the output signals can be made dynamically variable.

Persons skilled in the art understanding the principles of the invention may now conceive of variations or other embodiments. All are considered to be within the sphere and scope of the invention, as defined in the claims appended hereto.

The embodiments of the invention in which an exclusive property or privilege is claimed are defined as follows:

1. A variable phase lock control comprising:
   (a) first storage means for digitally storing a representation of a first signal forming a substantially full cycle of a first predetermined waveform, the adresses of sequential elements of said first signal being sequential,
   (b) means for generating a first address signal designating the addresses of said first signal elements and addressing the first storage means sequentially and cyclically to read out the stored first signal,
   (c) second means for digitally storing a representation of a second signal forming a substantially full cycle of a second predetermined waveform, the addresses of sequential elements of said second signal being sequential, the number of elements of the first and second signals being similar,
   (d) means for generating a digital signal having a value between zero and the number of elements of said first and second signals,
   (e) means for adding said digital signal and the addresses of the first signal elements to provide a second address signal,
   (f) means for addressing the second storage means sequentially and cyclically with the second address signal to read out the stored second signal,
   whereby the read out first signal and the read out second signal have a phase relationship dependent on the value of the digital signal.

2. A variable phase lock control as defined in claim 1, in which the digital signal is established by manual control means.

3. A variable phase lock control as defined in claim 1, in which the first and second means for storing said first and second signals are Read Only Memories (ROMs).

4. A variable phase lock control as defined in claim 3, in which the ROMs are each adapted to output signal representations of sequential elements of sine waves upon being progressively addressed with sequential digital addresses.

5. A variable phase lock control as defined in claim 1, 3 or 4 in which the digital signal is established by a binary signal generator operated from a source of control signals.

6. A vaqiable phase lock control comprising:
   (a) a first oscillator,
   (b) a first counter connected to the output of the oscillator for counting output pulses from said oscillator and generating sequential first address signals corresponding to the number of said pulses counted, including means for resetting said counter after a predetermined number of pulses,
   (c) a first ROM, having digital representations of sequential elements of a substantially full cycle of a first predetermined signal waveform stored at sequential memory addresses, its address input being connected to the output of the first counter and adapted to output said digital representations sequentially upon reception of said sequential address signals.
   (d) a binary signal generator for providing a binary signal,
   (e) adding means having its inputs respectively connected to the binary signal generator and to the output of said first counter, adapted to add said address signals and the binary signal, to provide second address signals, (f) a second ROM, having digital representations of sequential elements of a substantially full cycle of a second predetermined signal waveform stored at sequential memory addresses, the number of signal element storage addresses being the same as in the first ROM, its address input being connected to the output of the adding means, and adapted to output said digital representations sequentially upon reception of said sequential second address signals, whereby the read out first predetermined signal and the read out second predetermined signal have a phase relationship dependent on the value of the binary signal.

7. A variable phase lock control as defined in claim 6, in which the stored first predetermined signal waveform and the stored second predetermined signal waveform are the same.

8. A variable phase lock control as defined in claim 7 in which said first and second signals are sine waveforms.

9. A variable phase lock control as defined in claim 6, in which the stored first predetermined signal waveform and the stored second predetermined signal waveform are different.

10. A variable phase lock control as defined in claim 6, 7 or 9 in which the frequency of the oscillator is variable, whereby the output frequency of said first and second predetermined signals can be controlled, and said binary signal generator includes means for selecting said binary signal between zero and a number corresponding to the number of signal element storage addresses in one of said ROMs.

11. A variable phase lock control as defined in claim 6, 7 or 9 in which the frequency of the oscillator is variable, whereby the output frequency of said first and second predetermined signals can be controlled and further including a digital to analog converter connected to the output of each ROM for converting the output of said digital representations to analog waveforms, and low pass filter means connected to the output of each said converter for removing ripple remaining in said analog waveforms.

12. A variable phase lock control as defined in claim 6, 7 or 9 in which the frequency of the oscillator is variable, whereby the output frequency of said first and second predetermined signals can be controlled, said binary signal generator including a control calibrated from 0° to 360° having a decimal digital signal output proportioning the number of address locations storing said elements of said signal among 360 evenly divided parts, the control being adapted to output said decimal digital signal to a decimal to binary converter, the output of said decimal to binary converter being connected to said adding means.

13. A variable phase lock control comprising:
(a) a first oscillator,
(b) a first counter connected to the output of the oscillator for counting output pulses from said oscillator and generating sequential first address signals corresponding to the number of said pulses counted, including means for resetting said counter at a predetermined address,
(c) a first ROM, having digital representations of sequential elements of a substantially full cycle of a first predetermined signal waveform stored at sequential memory addresses, its address input being connected to the output of the first counter and adapted to output said digital representations sequentially upon reception of said sequential address signals,
(d) a binary signal generator for providing a binary signal,
(e) a register for storing a digital representation of the binary signal,
(f) a second counter, being connected to the output of the register and the output of the oscillator, for counting output pulses from said oscillator in sequence from the digital representation of the binary signal, to generate sequential second address signals corresponding to the number of pulses counted in addition to said digital representation of the binary signal, including means for resetting the counter at said predetermined address,
(g) a second ROM, having digital representations of sequential elements of a substantially full cycle of a second predetermined signal waveform stored at sequential memory addresses, the number of signal element storage addresses being the same as in the first ROM, its address input being connected to the output of the second counter, and adapted to output said digital representations sequentially upon reception of said sequential second address signals, whereby the read out first predetermined signal and the read out second predetermined signal have a phase relationship dependent on the value of the binary signal.

14. A variable phase lock control as defined in claim 13, in which the stored first predetermined signal waveform and the stored second predetermined signal waveform are the same.

15. A variable phase lock control as defined in claim 14 in which said first and second signals are sine waveforms.

16. A variable phase lock control as defined in claim 13, in which the stored first predetermined signal waveform and the stored second predetermined signal waveform are different.

17. A variable phase lock control as defined in claim 13, 14 or 16 in which the frequency of the oscillator is variable, whereby the output frequency of said first and second predetermined signals can be controlled, and said binary signal generator includes means for selecting said binary signal between zero and a number corresponding to the number of signal element storage addresses in one of said ROMs.

18. A variable phase lock control as defined in claim 13, 14 or 16 in which the frequency of the oscillator is variable, whereby the output frequency of said first and second predetermined signals can be controlled, and further including a digital to analog converter connected to the output of each ROM for converting the output of said digital representations to analog waveforms, and low pass filter means connected to the output of each said converter for removing ripple remaining in said analog waveforms.

19. A variable phase lock control as defined in claim 13, 14 or 16 in which the frequency of the oscillator is variable, whereby the output frequency of said first and second predetermined signals can be controlled, said binary signal generator including a control calibrated from 0° to 360° having a decimal digital signal output proportioning the number of address locations storing said elements of said signal among 360 evenly divided parts, the control being adapted to output said decimal digital signal to a decimal to binary converter, the output of said decimal to binary converter being connected to said adding means.

20. A method of generating a pair of phase locked signals comprising:
repetitively addressing a pair of memories at addresses at which sequential elements of predetermined waveshape signals are digitally stored at sequential memory locations, and maintaining a predetermined address increment between the addresses to the respective memories, to provide a pair of output signals.

21. A method of generating a pair of phase locked signals as defined in claim 20, further including the further step of converting the output signals of the memories to a pair of analog signals, and of filtering the analog signals to substantially remove ripple carried thereby.

* * * * *